United States Patent [19]
Briggs et al.

[11] Patent Number: 5,254,496
[45] Date of Patent: Oct. 19, 1993

[54] SEMICONDUCTOR MIXED CRYSTAL QUANTUM WELL DEVICE MANUFACTURE

[75] Inventors: Alan T. R. Briggs, Stansted Mountfitchet; Julia M. Jowett, Dorridge, both of United Kingdom

[73] Assignee: Northern Telecom Limited, Montreal, Canada

[21] Appl. No.: 4,436

[22] Filed: Jan. 14, 1993

[30] Foreign Application Priority Data

Jan. 17, 1992 [GB] United Kingdom ............... 9200988

[51] Int. Cl.$^5$ ............................................. H01L 21/20
[52] U.S. Cl. ........................... 437/133; 148/DIG. 160
[58] Field of Search ............... 437/133, 126, 128; 156/601, 613, DIG. 70; 148/DIG. 160

[56] References Cited

U.S. PATENT DOCUMENTS

| | | | |
|---|---|---|---|
| 4,801,557 | 1/1989 | Wessels et al. | 437/133 |
| 4,963,508 | 10/1990 | Umeno | 437/132 |
| 5,192,711 | 3/1993 | Murakami et al. | 437/128 |

FOREIGN PATENT DOCUMENTS

| | | |
|---|---|---|
| 0426419 | 5/1991 | European Pat. Off. . |
| 0476689 | 3/1992 | European Pat. Off. . |
| 2666455 | 3/1991 | France . |
| 144015 | 7/1986 | Japan ............... 437/133 |
| 236220 | 10/1991 | Japan ............... 437/613 |

OTHER PUBLICATIONS

Y. Nishikawa, et al., "Lattice Constant Shift in Zn--Doped InGaAlP Grown by Low Pressure Metalorganic Chemical Vapor Deposition" Journal of Crystal Growth 100 (1990) pp. 63-67.

J. P. André, et al., "GaInP-AlGaInP-GaAs Heterostructures Grown by MOVPE at Atmospheric Pressure" Journal of Crystal Growth 77 (1986) pp. 354-359.

B. I. Miller et al, App. Phys. Lett., vol. 58, pp. 1952-1954 (1991).

G. P. Seltzer et al, Electronics Lett., vol. 27, pp. 1268-1269 (1991).

M. Yamamoto et al, J. Crystal Growth, vol. 107, pp. 790-801 (1991).

M. Rosenweig et al, J. Crystal Growth, vol. 107, pp. 802-805 (1991).

P. J. A. Thijs et al, J. Crystal Growth, vol. 105, pp. 339-347 (1991).

J. P. Andre et al, Extended Abstract of 20th Conference on Solid State Devices and Materials, Aug. 24, 1988, Tokyo, pp. 387-390.

*Primary Examiner*—Brian E. Hearn
*Assistant Examiner*—Linda J. Fleck
*Attorney, Agent, or Firm*—Lee, Mann, Smith, McWilliams, Sweeney & Ohlson

[57] ABSTRACT

A strain-compensated III-V quantum well device is grown by vapor phase epitaxy using the same relative atomic proportions of indium and gallium in both the quantum well layers (20) and the barrier layers (21). The top and bottom barrier layers of the quantum well stack are half the thickness of the other barrier layers of the stack.

18 Claims, 4 Drawing Sheets

SEMICONDUCTOR MIXED CRYSTAL QUANTUM WELL DEVICE MANUFACTURE

BACKGROUND OF THE INVENTION

This invention relates to quantum well device manufacturing by vapor phase epitaxy, and in particular to the manufacture of strained quantum well devices.

For the purpose of this specification a quantum well stack is defined to mean, in respect of a single quantum well structure device, a single quantum well layer sandwiched between two barrier layers of higher bandgap material, and in respect of a multi-quantum well structure device, a plurality of n quantum well layers sandwiched alternately between (n+1) barrier layers of higher band gap material.

An example of such strained quantum well stack devices are the lasers described by M. Yamamoto et al., 'Strained-layer InGaAs/InGaAsP MQW structures and their application to 1.67 μm lasers grown by metalorganic vapor phase epitaxy', Journal of Crystal Growth, Vol. 107, No. 1/4, January 1991 pages 796-801.

In a vapor phase epitaxy reactor system the reagents fed to a reaction chamber are derived from source lines, in each of which an individual reagent, or reagent mixture, flows with a flux that may be controlled independently of the fluxes in the other source lines of the system. Usually, but not necessarily, for any particular growth there is one source line feeding the reaction chamber per elemental component of that growth. The elemental composition of the material grown in the reaction chamber depends upon the fluxes of the reagents in the various source lines, and also upon other parameters such as temperature and pressure. When making the transition from growing one material to growing a different material it is not normally possible to change the flux in an individual source line, or the fluxes in a set of such lines, sufficiently quickly in order to be able to proceed with the growth without interruption. Such interruption is generally undesirable because of the risk of degradation of the exposed surface liable to occur in the interval before growth recommences. This problem is conveniently circumvented by employing different source lines for supplying the same reagent at different fluxes, and switching between these source lines in order to effect the desired changes in composition of the material being grown.

In any particular vapor phase epitaxy reactor system the settings of source line fluxes required to produce a desired composition (or bandgap and bulk lattice parameter) of growth are normally determined by an iterative procedure that involves growing a calibration layer with approximately appropriate flux settings, determining the composition (or bandgap and bulk lattice parameter) of the material actually grown, and then making appropriate adjustments to the fluxes before repeating the procedure. The determination of the composition (or bandgap and bulk lattice parameter) grown under any particular set of flux settings typically requires the growth of a calibration layer of a thickness that is greater than that for instance of a quantum well layer. Particularly in the case of attempting to grow strained quantum well layers, this can present difficulties because the bulk lattice parameter mismatch may be so great that the growth of a calibration layer of sufficient thickness is not possible without introducing such a high dislocation density in the grown material as to render it impossible, or at least very difficult, to make the bandgap and bulk lattice parameter measurements necessary to determine its composition.

SUMMARY OF THE INVENTION

According to the present invention there is provided a method of making, by vapor phase epitaxial growth upon a substrate, a semiconductor mixed crystal quantum well device that includes a quantum well stack that consists of one or more mixed crystal ternary quantum well layers interleaved between mixed crystal quaternary barrier layers of a material three of whose four constituent elements are the three constituent elements of the ternary material of the quantum well layers, wherein the bulk lattice parameter of the material of said one or more quantum well layers is mismatched with respect to that of the substrate, and wherein the flux of the epitaxial growth source materials of two elements of the same group of the Periodic Table remains unchanged during the vapor phase epitaxial growth of said quantum well and barrier layers, whereby in the resulting device the relative atomic proportions of said two elements are substantially the same in its quantum well and barrier layers.

A particular application of the present invention lies in the construction of mixed crystal Group III-V devices by vapor phase epitaxy. Thus, by making the atomic ratio of gallium to indium the same in both the quantum well and the barrier layers of such a device, a reduction in the number of source lines required is achieved. This is advantageous in that it allows a simpler, cheaper reactor system to be used, or allows greater flexibility of construction in other parts of the device. For instance, in the construction of a single or multi-quantum well laser or optical amplifier, the use of the same indium to gallium ratio in the quantum well and barrier layers may free sufficient additional source lines of a particular reactor to enable the construction of a device in which the assembly of quantum well and barrier layers is itself sandwiched between optical waveguide layers, preferably layers that have a bulk lattice parameter substantially matched with that of the substrate, and that are themselves bounded on their externally facing major surfaces by lower bandgap material.

The use of the same indium to gallium ratio in the quantum well and barrier layers of a strained (multi-) quantum well laser or optical amplifier can circumvent the need to make some or all of the measurements of the composition of the quantum well material. For instance, if the barrier layers are known by calibration to be made of $In_xGa_yAl_{1-x-y}As$ where x and y have particular assigned values, and if the quantum well layer material is specifically grown to be of the ternary material $In_zGa_{1-z}As$ where $z=x/(x+y)$ so that the indium to gallium ratio of the ternary material matches that of the quaternary material, then the composition of the quantum well material, its bandgap and its bulk lattice parameter, are fully determined without reference to making any qualification measurements directly upon that quantum well composition material. Being able to derive the composition of the quantum well material from an analysis of that of the barrier layer material is particularly advantageous in the case of highly strained quantum layer material growth because, though the barrier layer material may also be strained in order to offset the strain in the quantum well material and thus reduce the average strain in the device, the thickness of barrier layers is typically significantly larger than that of quantum well layers. Hence the strain density present in the barrier layers is correspondingly smaller, thereby making it significantly easier to grow relatively dislocation-free barrier layer material layers of sufficient thickness for compositional analysis than it would be to grow equivalent quality and thickness layers of the quantum well layer material.

The subject matter of the preceding paragraph was directed particularly to the advantages that flow from the present invention in its application to the construction of a strained (multi-) quantum well device in which the III-V quantum well layer material has two group III constituent elements and one group V constituent element, and in which the barrier layer material also has those three constituents in quaternary material together with an additional group III constituent element. A similar situation also exists if the additional constituent element of the quaternary barrier layer material is a group V constituent such as phosphorus. In this case there is the added advantage that vapor phase epitaxial growth, particularly metal organic vapor phase epitaxy, is normally performed under Group V-rich reagent conditions, with the result that the deposition rate is determined primarily by the Group III source line flux. In this instance the Group III source line flux is the same for the growth of quantum well layers and the growth of the barrier layers and hence, provided that the aggregate of the other fluxes remains the same so that the dilution factor is unchanged, then the growth rates are the same. This in turn means that the relative thickness of the quantum well layers and the barrier layers is in direct proportion to their relative growth times. Thus, being armed with the knowledge of the compositions of the two types of layer, and hence of their respective bulk lattice parameter mismatch with respect to the substrate material, it is easy to calculate the relative growth times required in order to produce any particular desired measures of average strain in the device as a whole, whether fully compensating for the strain in the quantum well layer or layers, or undercompensating or overcompensating for that strain.

Typically phosphine is used as the source material (phosphorus precursor) for the phosphorus content of the quaternary material of the barrier layers and, whenever the growth of this quaternary material is replaced by the growth of the ternary material of the quantum well layers, the flux of the phosphorus precursor is typically replaced by an additional compensating flux of hydrogen. The purpose of this compensating flux of hydrogen is to prevent the material growth changeover between quanternary and ternary from producing an attendant change in pressure in the locality of the epitaxial deposition. Since however hydrogen is less viscous than phosphine, this additional compensating flux of hydrogen needs to be slightly greater than the phosphine flux it replaces in order to achieve full compensation. In consequence the Group III source line flux dilution factor is slightly greater during the growth of the ternary material, with the result that the growth rate is correspondingly slightly smaller. To a first approximation a small increase in dilution by some factor K produces a reduction in growth rate by the same factor K. Hence, since the ratio of the dilution factors is known in any particular growth regime, the ratio of the growth rates, to a first approximation, is also known, and thus can be allowed for in calculating the relative growth times necessary to grow a desired layer thickness ratio.

In an optoelectronic quantum well device, such as a laser, amplifier or modulator, the quantum well stack is typically sandwiched together with a waveguide layer between layers of lower refractive index material to provide an optical waveguiding structure. The waveguide layer may be formed in two parts, one above the stack and the other beneath it. The use of the half-thickness barrier layers at the top and bottom of the stack facilitates achieving full stress compensation within the body of the stack since the stack can be considered as being formed of a set of identical symmetrical building blocks, each comprising a quantum well layer sandwiched between two half-thickness barrier layers. Provided that these symmetrical building blocks are individually stress balanced, then there is full stress balance within the stack considered as a whole, with the result that the waveguide layer can safely be made of material whose bulk lattice parameter is substantially matched with that of the substrate. Additionally the design can simply be modified to incorporate a larger, or smaller, number of building blocks according to how many quantum wells are required in any particular instance.

The invention also provides a semiconductor mixed crystal quantum well device that includes a quantum well stack that consists of a plurality of mixed crystal quantum well layers interleaved between mixed crystal barrier layers, wherein the bulk lattice parameter of the quantum well and barrier layers are respectively positively and negatively, or negatively and positively, mismatched with respect to the bulk lattice parameter of the substrate, wherein the quantum well layers all have the same composition and thickness, and wherein the barrier layers all have the same composition and thickness except for the top and bottom barrier layers of the stack, which have the same composition as that of the other barrier layer or layers of the stack, but only half the thickness.

BRIEF DESCRIPTION OF THE DRAWINGS

There follows a description of the growth of strain-compensated multiple quantum well lasers embodying the invention in preferred forms. The description refers to the accompanying drawings in which.

DETAILED DESCRIPTION OF THE PREFERRED EMBODIMENT

Figure 1:
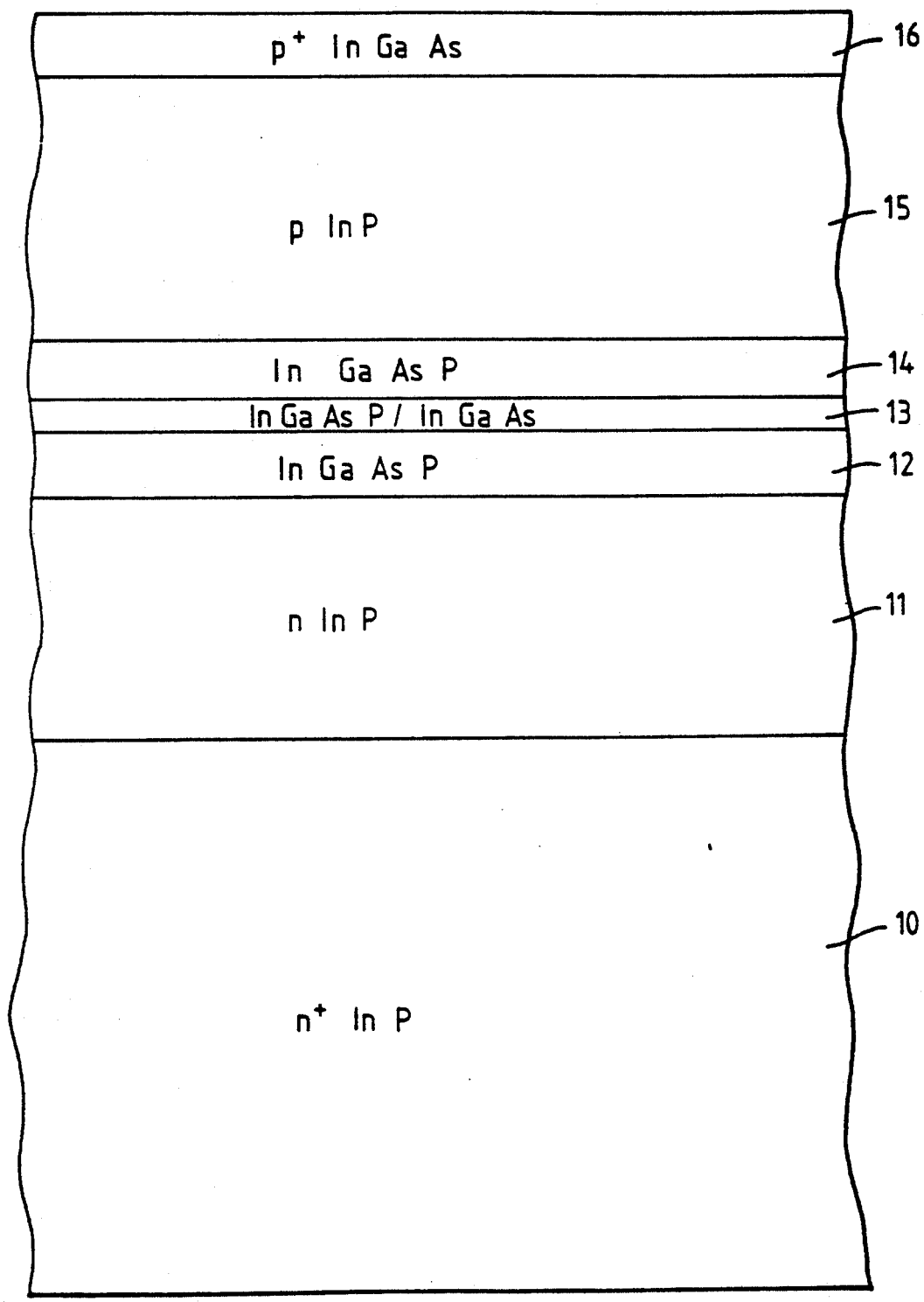
FIG. 1 is a diagram depicting the general layer structure of a multiple quantum well laser.
Figure 2:
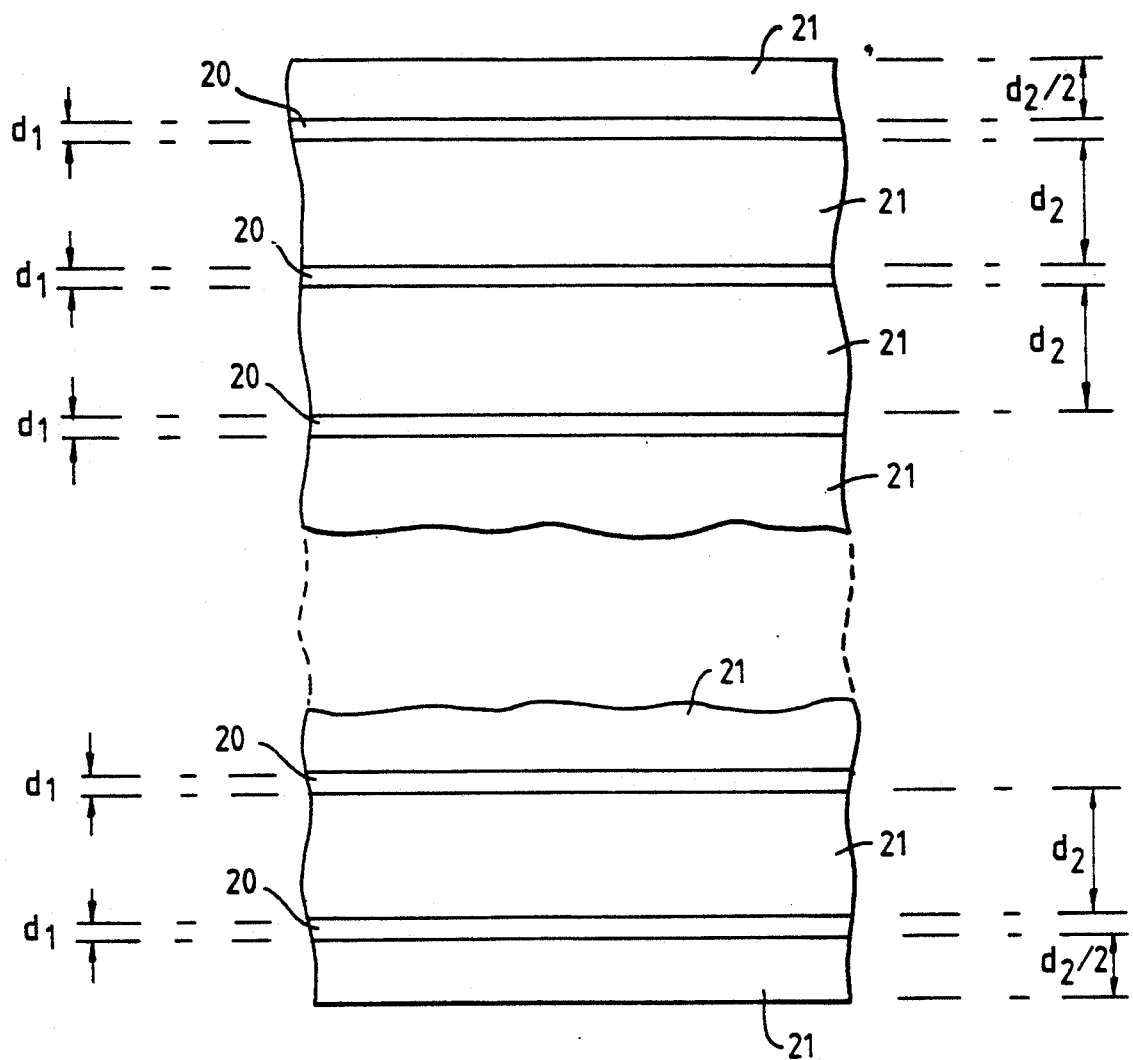
FIG. 2 is a diagram depicting the layer structure of the quantum well stack of the laser of FIG. 1.
Figure 3:
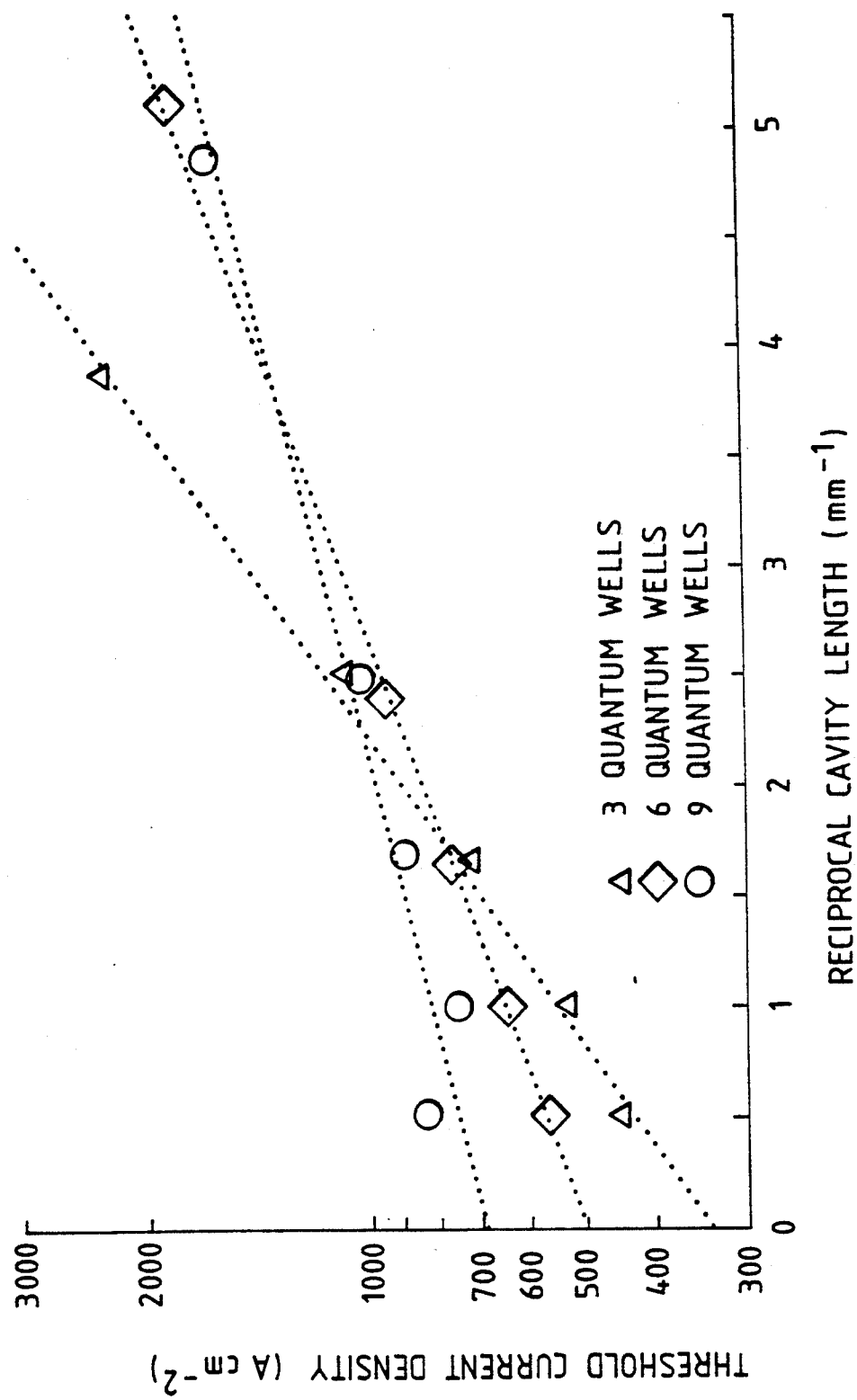
FIG. 3 is a plot of threshold current against reciprocal cavity length.

Referring to FIG. 1, each strain-compensated multiple quantum well laser embodying the present invention is grown on the (100) face of an n$^+$ doped (sulphur doped) InP substrate 10 by organo-metallic vapour phase epitaxy (OMVPE) at low pressure in a pressure balanced vent-run system. The first epitaxial layer to be grown is an n-type (silicon doped) InP buffer layer 11 which is typically between 1 and 4 $\mu$m thick. This growth is covered by the growth of a waveguide layer 12 typically between 0.05 and 0.3 $\mu$m thick of quaternary InGaAsP whose bulk lattice parameter is substantially matched with that of the InP substrate 10. Next is grown the layers constituting the quantum well stack 13 of the laser. The layers that constitute this stack 13 are not separately depicted in FIG. 1, but only in FIG. 2. They comprise a set of n quantum well layers 20 sandwiched alternately between a set of (n+1) barrier layers 21. All the quantum well layers 20 have the same thickness and are made of the same ternary InGaAs material. All the barrier layers 21 are similarly made of the same material, in this instance a quaternary InGaAsP material. All the barrier layers 21 have the same thickness, except for the top and bottom layers 21, which are half the thickness of the others. Following the growth of the quantum well stack, is grown a further waveguide layer 14 which typically is like the waveguide layer 12 in composition and thickness. This is covered by the growth of a p-type (zinc-doped) InP cladding layer 15 typically between 1 and 2 $\mu$m thick, which is itself covered by a $p^+$-type InGaAs contact layer 16, which is typically between 0.1 and 0.3 $\mu$m thick and has a composition providing it with a bulk lattice parameter substantially matched with that of the InP substrate 10.

The quantum well stack 13 and the two waveguide layers 12 and 14 are typically grown undoped, but may be grown in doped form, for instance p-type doping can be advocated for high speed performance. If grown in doped form, the doping must be such as to leave the total structure with effectively a single p-n junction. The function of the waveguide layers 12 and 14 is to provide an optical core region of higher refractive index than that of the optical cladding region constituted by the InP layers 11 and 15. It should be understood that these two waveguide layers 12 and 14 do not necessarily have to have the same refractive index, nor do they individually need to be of constant refractive index through their respective thicknesses, but may be graded in composition to provide a refractive index graded optical core region.

By way of particular example, the barrier layers 21 were grown under conditions providing the approximate composition $In_{0.69} Ga_{0.31} As_{0.62} P_{0.38}$ ($\lambda_g = 1.29$ $\mu$m) which has a bulk lattice parameter 0.17% smaller than that of the InP substrate. The quantum well layers were grown of ternary material under conditions providing them with the same atomic proportions of indium and gallium as that of the barrier layers, and hence had the composition $In_{0.69} Ga_{0.31} As$. This also has a bulk lattice parameter mismatched with respect to the InP substrate, in this instance being 1.06% greater than that of InP.

Taking account of the greater Group III source flux dilution factor present during the growth of the quantum well layers 20 than during the growth of the barrier layers 21, it was calculated that strain-compensation should be achieved with a growth time ratio of 6.4:1 (barrier layer growth: quantum well layer growth). The quantum well growth time was chosen in this particular instance to provide a quantum well layer thickness of 2.2 nm.

A range of broad (54 $\mu$m) stripe contact lasers without facet coatings were constructed and their threshold current densities were measured at 20° C. In order to provide these lasers with optical waveguides that were of relatively small effective optical depth, and that were relatively insensitive to change in number of quantum well layers in their quantum well stacks, the waveguide layers 12 and 14 were made of 0.13 $\mu$m thick of InGaAsP ($\lambda_g = 1.18$ $\mu$m) having its bulk lattice parameter substantially matched with that of the InP substrate 10. Some of the range had three quantum well layers to the stack, others had six, and yet others had nine. Moreover, for each number of quantum wells to the stack, there were lasers of five different cavity lengths. For each combination of number of quantum wells to the stack and of length of cavity, tests of threshold current were performed on at least six samples to obtain a mean value of threshold current density for that combination.

Figure 4:
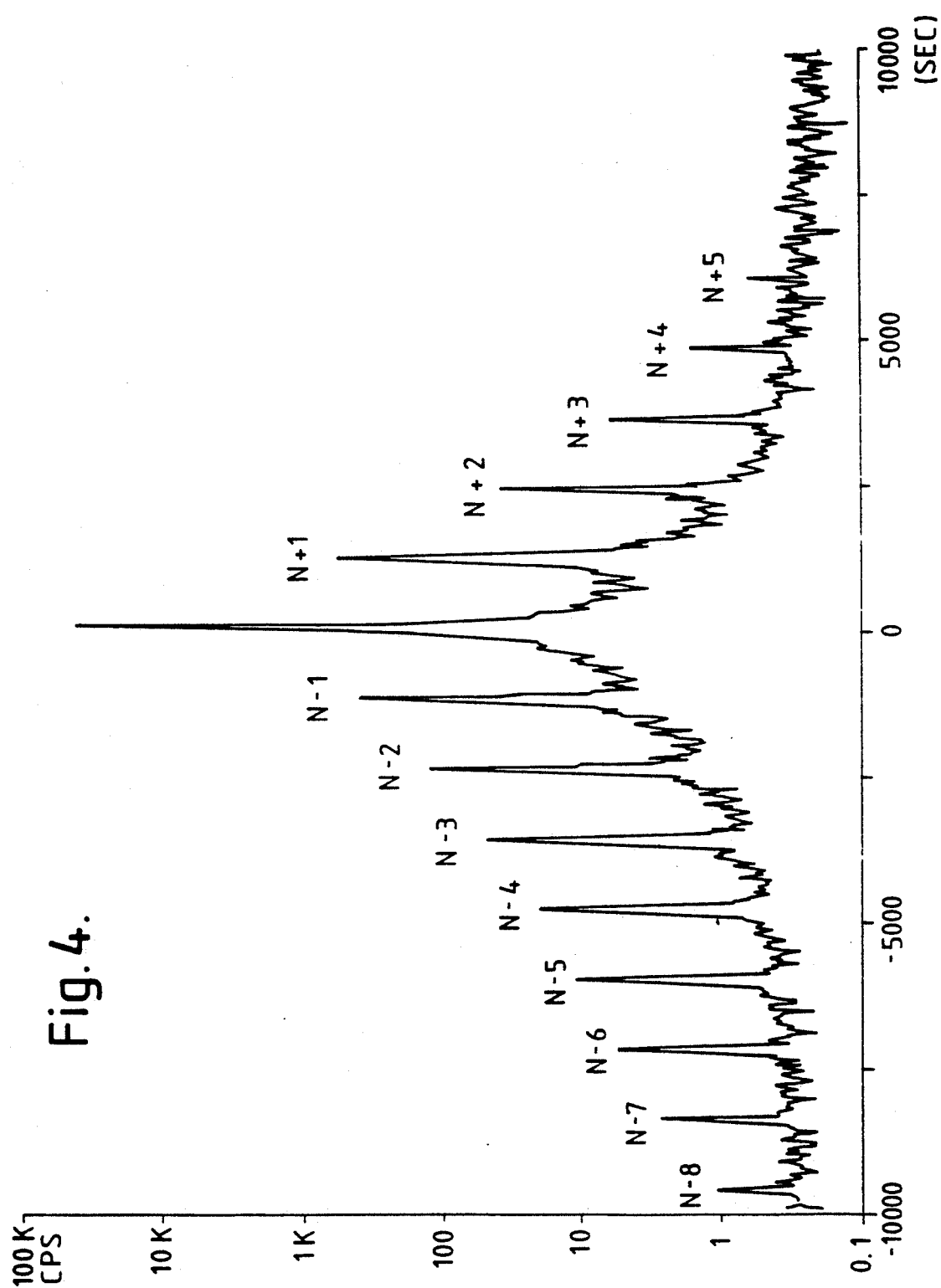
FIG. 4 is a plot of the x-ray rocking curve for a 20-well test structure.

An indication of the closeness of the strain-compensation achieved with these lasers is given by the results of an x-ray rocking curve plot given in FIG. 4 for a twenty quantum well stack test structure. In this figure, relative x-ray intensity (counts per second) is plotted as a function of angle (seconds of arc). The plot shows that the strain is so closely compensated that the x-ray intensity peak due to the InP substrate is not resolved from the zero order peak of the set of satellite peaks generated by the periodicity of the quantum well stack structure.

We claim:

1. A method of making, by vapour phase epitaxial growth upon a substrate, a semiconductor mixed crystal quantum well device that includes a quantum well stack that consists of one or more mixed crystal ternary quantum well layers interleaved between mixed crystal quaternary barrier layers of a material three of whose four constituent elements are the three constituent elements of the ternary material of the quantum well layers, wherein the bulk lattice parameter of the material of said one or more quantum well layers is mismatched with respect to that of the substrate, and wherein the flux of the epitaxial growth source materials of two elements of the same group of the Periodic Table remains unchanged during the vapour phase epitaxial growth of said quantum well and barrier layers, whereby in the resulting device the relative atomic proportions of said two elements are substantially the same in its quantum well and barrier layers.

2. A method as claimed in claim 1, wherein the material of the barrier layers is grown with a composition having its bulk lattice parameter mismatched with respect to that of the substrate, and wherein the bulk lattice parameter of the quantum well and the barrier layers are respectively and negatively, or negatively and positively, mismatched with respect to the bulk lattice parameter of the substrate.

3. A method as claimed in claim 2, wherein the material of the barrier layers is grown with a composition having its bulk lattice parameter smaller than that of the substrate.

4. A method as claimed in claim 2, wherein the device is a multi-quantum well device whose quantum well layers are all grown with the same composition and layer thickness, and whose barrier layers are all grown with the same composition and layer thickness except for the top and bottom barrier layers of the stack, which have the same composition as that of the other barrier layer or layers of the stack, but only half the thickness.

5. A method as claimed in claim 4, wherein the layers of the quantum well stack are grown with a composition and thickness that produces a substantially strain-compensated quantum well stack.

6. A method as claimed in claim 1, wherein the epitaxial growth is the epitaxial growth of Group III-V material.

7. A method as claimed in claim 6, wherein said two elements of the same group of the Periodic Table are elements of Group III.

8. A method as claimed in claim 7, wherein said two elements of Group III are indium and gallium.

9. A method as claimed in claim 8, wherein two or each quantum well layer is epitaxially grown of InGaAs and each barrier layer is epitaxially grown of InGaAsP.

10. A method as claimed in claim 1, wherein the quantum well stack is grown sandwiched, together with at least one epitaxially grown waveguide layer, between epitaxially grown layers of material having a lower refractive index than that of said at least one waveguide layers so as to provide an optical waveguiding structure, and wherein said at least one waveguide is grown with a composition having its bulk lattice parameter substantially matched with that of the substrate.

11. A method as claimed in claim 10, wherein the material of the barrier layers is grown with a composition having its bulk lattice parameter mismatched with respect to that of the substrate, and wherein the bulk lattice parameter of the quantum well and the barrier layers are respectively and negatively, or negatively and positively, mismatched with respect to the bulk lattice parameter of the substrate.

12. A method as claimed in claim 11, wherein the material of the barrier layers is grown with a composition having its bulk lattice parameter smaller than that of the substrate.

13. A method as claimed in claim 11, wherein the device is a multi-quantum well device whose quantum well layers are all grown with the same composition and layer thickness, and whose barrier layers are all grown with the same composition and layer thickness except for the top and bottom barrier layers of the stack, which have the same composition as that of the other barrier layer or layers of the stack, but only half the thickness.

14. A method as claimed in claim 13, wherein the layers of the quantum well stack are grown with a composition and thickness that produces a substantially strain-compensated quantum well stack.

15. A method as claimed in claim 14, wherein the epitaxial growth is the epitaxial growth of Group III-V material.

16. A method as claimed in claim 15, wherein said two elements of the same group of the Periodic Table are elements of Group III.

17. A method as claimed in claim 16, wherein said two elements of Group III are indium and gallium.

18. A method as claimed in claim 17, wherein two or each quantum well layer is epitaxially grown of InGaAs and each barrier layer is epitaxially grown of InGaAsP.

* * * * *